US012801017B2

(12) United States Patent
Chen et al.

(10) Patent No.: US 12,801,017 B2
(45) Date of Patent: Nov. 17, 2026

(54) POSITIVE-WORKING PHOTORESIST COMPOSITION WITH IMPROVED PATTERN PROFILE AND DEPTH OF FOCUS (DOF)

(71) Applicant: Merck Patent GmbH, Darmstadt (DE)

(72) Inventors: Hung-Yang Chen, Somerset, NJ (US); Kun Si, Hillsborough, NJ (US); Chunwei Chen, Whitehouse Station, NJ (US); Zhong Li, Bridgewater, NJ (US); Hengpeng Wu, Hillsborough, NJ (US)

(73) Assignee: Merck Patent GmbH, Darmstadt (DE)

( * ) Notice: Subject to any disclaimer, the term of this patent is extended or adjusted under 35 U.S.C. 154(b) by 749 days.

(21) Appl. No.: 18/256,340

(22) PCT Filed: Jan. 5, 2022

(86) PCT No.: PCT/EP2022/050108

§ 371 (c)(1),
(2) Date: Jun. 7, 2023

(87) PCT Pub. No.: WO2022/148759

PCT Pub. Date: Jul. 14, 2022

(65) Prior Publication Data

US 2024/0045333 A1 Feb. 8, 2024

Related U.S. Application Data

(60) Provisional application No. 63/280,310, filed on Nov. 17, 2021, provisional application No. 63/134,608, filed on Jan. 7, 2021.

(51) Int. Cl.
*G03F 7/039* (2006.01)
*G03F 7/004* (2006.01)
(Continued)

(52) U.S. Cl.
CPC ............ *G03F 7/039* (2013.01); *G03F 7/0048* (2013.01); *G03F 7/162* (2013.01); *G03F 7/2004* (2013.01)

(58) Field of Classification Search
CPC ...... G03F 7/039; G03F 7/2004; G03F 7/0226; G03F 7/0236
See application file for complete search history.

(56) References Cited

U.S. PATENT DOCUMENTS 5,601,961 A * 2/1997 Nakayama ............... C08G 8/08
430/192
5,977,288 A * 11/1999 Rahman ................ G03F 7/0236
528/480
(Continued)

FOREIGN PATENT DOCUMENTS

CN 1141732 C 3/2004
EP 1326906 A2 7/2003
(Continued)

OTHER PUBLICATIONS

International Search Report and Written Opinion, PCT/EP2022/050108, Jan. 5, 2022.
(Continued)

*Primary Examiner* — Keith Walker
*Assistant Examiner* — Alexander N. Lee
(74) *Attorney, Agent, or Firm* — EMD Performance Materials Corp.

(57) ABSTRACT

The disclosed subject matter relates to resist compositions that include the following components: Component a) a blend of two Novolak polymers having structures (I) and (II); component b) a diazo-naphthoquinone sulfonate (DNQ-PAC) component which is a single material or a mixture of materials having general formula having structure (III) or having general formula (III-1); is a dissolution enhancer component comprising a polyphenolic compound which is a single compound or a mixture of at least two compounds selected from the group consisting of an oligomeric fractionated Novolak, a compounds having general structure (VI) and a compound having general structure (VII), wherein $R_{de1}$, $R_{de2}$, $R_{de3}$, $R_{de4}$ and $R_{de5}$ are individually selected from a C-1 to C-4 alkyl; component d) a surfactant; and component e) an organic spin casting solvent, and an optional component f) a heterocyclic thiol.

21 Claims, 4 Drawing Sheets

(51) Int. Cl.
*G03F 7/16* (2006.01)
*G03F 7/20* (2006.01)

(56) References Cited

U.S. PATENT DOCUMENTS

| | | | | |
|---|---|---|---|---|
| 6,756,178 | B2 | 6/2004 | Katano et al. | |
| 2003/0207195 | A1* | 11/2003 | Eilbeck | G03F 7/0236 430/326 |
| 2010/0167476 | A1* | 7/2010 | Yun | G03F 7/0236 257/E21.414 |
| 2022/0089811 | A1 | 3/2022 | Omatsu et al. | |

FOREIGN PATENT DOCUMENTS

| | | | |
|---|---|---|---|
| JP | 2002-090991 | A | 3/2002 |
| KR | 10-2005-0117085 | A | 12/2005 |
| KR | 20070057534 | A | 6/2007 |
| KR | 20140137047 | A | 12/2014 |
| WO | 2012/115029 | A1 | 8/2012 |
| WO | 2022148759 | A1 | 7/2022 |

OTHER PUBLICATIONS

"International Preliminary Report on Patentability received for PCT Application No. PCT/EP2022/050108, mailing date Jul. 20, 2023", 08 Pages.

* cited by examiner

| Example 2 (FT = 5 μm), DOF of 1.0 μm L/S @ 200 mJ/cm² | | | | | | |
|---|---|---|---|---|---|---|
| -0.25 μm | 0.0 μm | +0.25 μm | +0.5 μm | +0.75 μm | +1.0 μm | +1.25 μm |

| L/S | 1.5 µm | 1.3 µm | 1.0 µm | 0.9 µm | 0.8 µm |
|---|---|---|---|---|---|
| Example 2 (FT = 5 µm) @ 220 mJ/cm$^2$ |  |  |  |  |  |

Table 1. Summary of Lithography Performance at 1.0 µm L/S (5.0 µm film thickness)

| | | Dose-to-Print @ 1.0 µm L/S | Top CD (µm) | Bottom CD (µm) | SEM Image |
|---|---|---|---|---|---|
| Example | 1 | 240 | 0.725 | 1.180 |  |
| | 2 | 200 | 0.764 | 1.112 |  |
| | 3 | 140 | 0.861 | 1.151 |  |
| Comparative Example | 1 | 360 | 0.551 | 1.151 |  |
| | 2 | 100 | 0.832 | 0.716 |  |

POSITIVE-WORKING PHOTORESIST COMPOSITION WITH IMPROVED PATTERN PROFILE AND DEPTH OF FOCUS (DOF)

This application is a national stage application, filed under 35 U.S.C. § 371, of International Patent Application No. PCT/EP2022/050108 (filed on 5 Jan. 2022) which claims the benefit of U.S. Provisional Patent Application No. 63/134,608 (filed on 7 Jan. 2021) and U.S. Provisional Patent Application No. 63/280,310 (filed on 17 Nov. 2021) each of which applications is incorporated herein by reference in their entirety.

FIELD

The disclosed subject matter pertains to a positive radiation-sensitive aqueous base soluble photoresist composition used for making integrated circuit (IC), light emitting diode (LED) devices and display devices.

BACKGROUND

Photoresist compositions are used in microlithographic processes for making miniaturized electronic components such as in the fabrication of computer chips, integrated circuits, light emitting diode (LED) devices and displays. Generally, in these processes, a film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When positive-working photoresist compositions are exposed image-wise to radiation, the areas of the resist composition exposed to the radiation become more soluble to a developer solution (e.g., release of base solubilizing group or photodecomposition of dissolution inhibitor), while the unexposed areas of the photoresist coating remain relatively insoluble to such a solution. Thus, treatment of an exposed positive-working resist with a developer causes removal of the exposed areas of the photoresist coating and the creation of a positive image in the coating, thereby uncovering a desired portion of the underlying substrate surface on which the photoresist composition was deposited.

The use of a positive-working, sensitive photoresist composition which is developable by aqueous base is known. Most of these compositions are either chemically amplified photoresists based on either phenolic or (meth)acrylate resin or non-chemically amplified photoresists based on Novolak/diazonaphthoquinone (DNQ). In a Novolak/DNQ photoresist a positive image is formed through the photodecomposition of the diazonaphthoquinone compound (PAC) which in resist areas exposed leads to a faster dissolution of the Novolak resin in aqueous base, these types of photoresists are employed at longer UV wavelengths such with i-line (365 nm) and were for many years workhorse photoresists in the manufacturing of integrated circuits (IC).

Semiconductor assembly process has been improved by wafer level packaging (WLP) introduction in high volume manufacturing. Copper (Cu)-Redistribution layer (RDL) miniaturization is one of key process for small, thin and light chip manufacturing. Fine pitch redistribution layer (RDL) is the market trend for high density wafer level fan-out (HDWLFO) packaging for semiconductors. Photoresist development with high resolution and transmittance is required to this technology realization on the topology substrate. Chemical amplified (CA) type photoresist indicated stable sensitivity and high resolution at various thickness because of its high transparency at i-line (365 nm) exposure. However, high price and poor environment stability limit its application in RDL fabrication for outsourced semiconductor assembly and test (OSAT) companies. Compared with CA-type photoresist, DNQ-based photoresist is advantageous in its cheaper price, better environmental stability, and post-exposure-bake (PEB) free, which are beneficial for OSAT companies. However, when resolving fine-pitch features, DNQ-based photoresists show pronounced top-loss (rounding) and footing due to the bleaching of i-line (365 nm) exposure by diazonaphthoquinone (DNQ) photoactive compound (PAC). For Cu-RDL fabrication by electroplating where no photoresist top-loss is allowed due to an unstable profile of copper lines (wide top/narrow bottom) is produced from a top-loss/footing photoresist profile.

For the method of improving profile of photoresist pattern, process modification is the commonly used strategy, such as hard baking photoresist lines (after development) with a temperature higher than its glass transition temperature (Tg) that thermal reflow photoresist structures to achieve the desired profile. However, this method decreases wafer throughput due to additional process steps.

SUMMARY

In order to meet requirements for improving profiles in semiconductor packaging, without the need of hard baking profiles, and solve the problem of decrease wafer throughput, new Novolak/DNQ-based photoresist formulations were developed targeting high resolution and vertical pattern profiles. These novel Novolak/DNQ-based photoresist formulations comprise two Novolak resins, one DNQ PAC, and one speed enhancer (dissolution enhancer), which unexpectedly show high resolution and vertical profile down to 0.9 μm line/space at 5.0 μm film thickness. Novel Novolak/DNQ-based photoresist formulations, unexpectedly also have significant less top-loss and also have greatly improved depth-of-focus (DOF) without any further process modifications. These novel Novolak/DNQ-based photoresist formulations give vertical profile with less top-loss, have high resolution, and fast photospeed, without the requirement of a post-exposure-bake (PEB) or post exposure hard-bake and show a larger process window (wider DOF), than conventional Novolak/DNQ-based photoresist formulations. These novel Novolak/DNQ-based photoresist formulations are environment stable with good shelf lives, employ low-cost components and also have formulations which are simple to prepare.

In one aspect these novel compositions are ones consisting essentially of components a), b), c), d) and e) or components a), b), c), d), e) and f) as follows:

Component a) is a blend of two Novolak polymers having structures (I) and (II); wherein $R_1$ to $R_9$ are individually selected from a C-1 to C-4 alkyl and x, y and z represent the mole % based on total moles of repeat units in the polymer of structure (I); k, l and m represent the mole % based on total moles of repeat units in the polymer of structure (II) and further wherein x ranges from about 10 to about 20 mole %, y ranges from about 50 to about 60 mole %, z ranges from about 30 to about 40 mole %, k ranges from about 10 to about 20 mole %, l ranges from about 40 to about 50 mole %, m ranges from about 30 to about 40 mole %, and further wherein for structure (I) the sum of x, y and z is 100 mole %, and in structure (II) the sum of k, l and m is 100 mole %; where the solids wt. % of said Novolak polymers of structure (I) and (II), preferably each independently range independently from about 25 wt. % to about 60 wt. % solids.

(I)

(Ia)

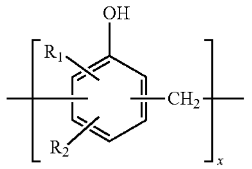

(Ib)

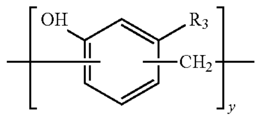

(Ic)

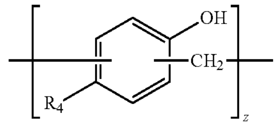

(II)

(IIa)

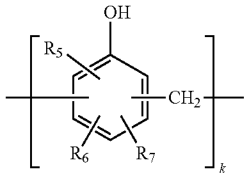

(IIb)

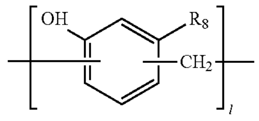

(IIc)

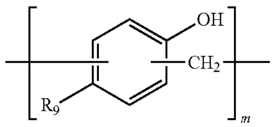

Component b) is a diazo-naphthoquinone sulfonate (DNQ-PAC) component which is a single material or a mixture of materials having general formula having structure (III) or having general formula (III-1); wherein $D_{1c}$, $D_{2c}$, $D_{3c}$, $D_{4c}$ and $D_{5c}$ are individually selected from H or a moiety having structures (IV) or (V), and further wherein in structure (III) at least one of $D_{1c}$, $D_{2c}$, $D_{3c}$ or $D_{4c}$ is a moiety having structure (IV) or (V) and in structure (III-1) at least one of $D_{1c}$, $D_{2c}$, $D_{3c}$, $D_{4c}$, $D_{5c}$ is a moiety having structure (IV) or (V); wherein said DNQ-PAC, preferably ranges from about 10 wt. % to about 15 wt. % total solids.

(III)

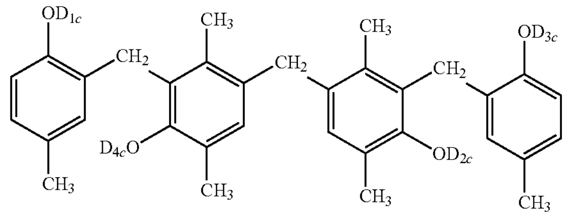

(III-1)

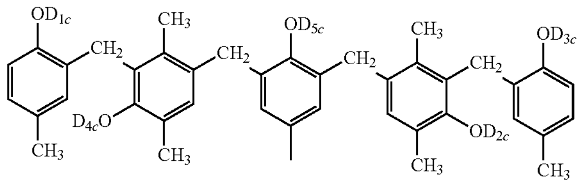

(IV)

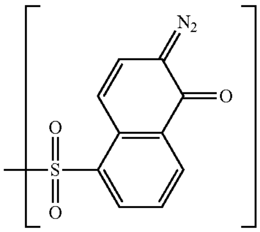

(V)

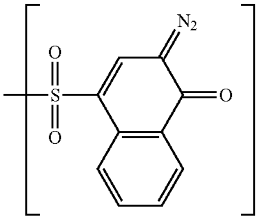

Component c) is a dissolution enhancer component comprising a polyphenolic compound which is a single compound or a mixture of at least two compounds selected from the group consisting of an oligomeric fractionated Novolak, a compounds having general structure (VI) and a compound having general structure (VII), wherein $R_{de1}$, $R_{de2}$, $R_{de3}$, $R_{de4}$ and $R_{de5}$ are individually selected from a C-1 to C-4 alkyl;

(VI)

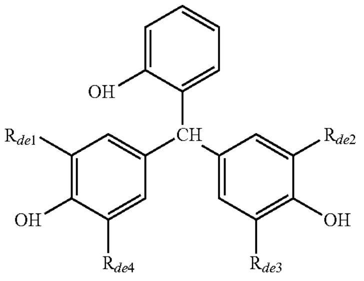

-continued (VII)

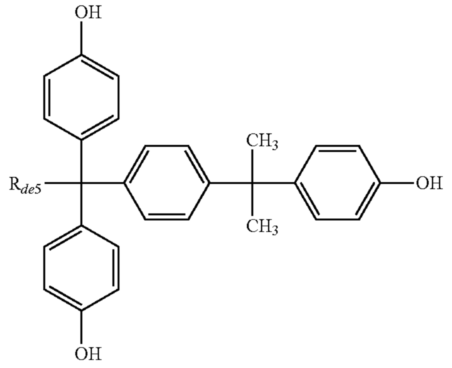

Component d) is a surfactant and ranges from about 0 wt. % to about 0.2 wt. % solids.

Component e) is an organic spin casting solvent.

Component f) is a heterocyclic thiol

Further, wherein the wt. % solids ranges of components a), b), c) and d), or a components a), b), c), d) and f) using a wt. % solids calculated from the total weight of components a), b), c) and d), or a), b), c), d) and f) which combined add up to 100 wt. % solids are as follows:

component a) is one wherein the wt. % solid of, said Novolak polymers of structure (I) and (II), each independently range from about 23 wt. % to about 70 wt. %, component b) ranges from about 9 wt. % to about 15 wt. %, component c) ranges from about 4 wt. % to about 15 wt. % and component d), ranges from about 0 wt. % to about 0.2 wt. %; and further this composition is free hexamethyl melamine crosslinkers and photoacid generators.

The disclosed subject matter also pertains to the method of coating the resist compositions on a substrate as part of a lithographic process.

BRIEF DESCRIPTION OF THE FIGURES

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter.

DETAILED DESCRIPTION

Figure 1:
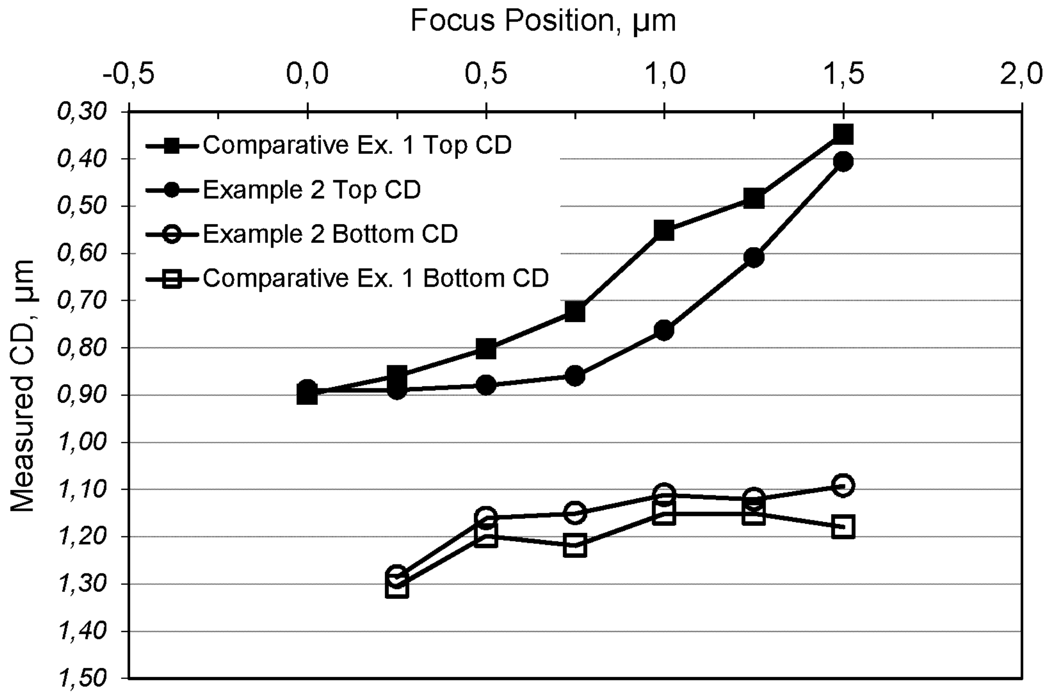
FIG. 1 Depth-of-Focus (DOF) Curves of Example 2 and Comparative Example 1.

It is to be understood that both the foregoing general description and the following detailed description are illustrative and explanatory and are not restrictive of the subject matter as claimed. In this application, the use of the singular includes the plural, the word “a” or “an” means “at least one,” and the use of “or” means “and/or,” unless specifically stated otherwise. Furthermore, the use of the term “including,” as well as other forms such as “includes” and “included,” is not limiting. Also, terms such as “element” or “component” encompass both elements and components comprising one unit and elements or components that comprise more than one unit, unless specifically stated otherwise. As used herein, the conjunction “and” is intended to be inclusive and the conjunction “or” is not intended to be exclusive unless otherwise indicated. For example, the phrase “or, alternatively” is intended to be exclusive. As used herein, the term “and/or” refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature references and similar materials defines a term in a manner that contradicts the definition of that term in this application, this application controls.

The term “linking point,” when referring to any of the inventive polymers refers to a branching point to another polymer chain and/or a crosslinking point to another polymer chain, where the extent of branching and/or crosslinking is such that the resultant branched and/or crosslinked polymer still has a molecular weight sufficiently low so as to avoid reaching the gel point where the polymer would become insoluble in solvents such as spin-casting solvents.

Unless otherwise indicated, “alkyl” refers to hydrocarbon groups which can be linear, branched (e.g., methyl, ethyl, propyl, isopropyl, tert-butyl and the like), cyclic (e.g., cyclohexyl, cyclopropyl, cyclopentyl and the like), or multicyclic (e.g., norbornyl, adamantly and the like). These alkyl moieties may be substituted or unsubstituted as described below. The term “alkyl” refers to such moieties with C-1 to C-20 carbons. It is understood that for structural reasons linear alkyls start with C-1, while branched alkyls and cyclic alkyls start with C-3 and multicyclic alkyls start with C-5. Moreover, it is further understood that moieties derived from alkyls described below, such as alkyloxy and haloalkyloxy, have the same carbon number ranges unless otherwise indicated. If the length of the alkyl group is specified as other than described above, the above-described definition of alkyl still stands with respect to it encompassing all types of alkyl moieties as described above and that the structural consideration with regards to minimum number of carbons for a given type of alkyl group still apply.

Alkyloxy (a.k.a. Alkoxy) refers to an alkyl group on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br or I which is linked by one bond to an organic moiety.

Haloalkyl refers to a linear, cyclic or branched saturated alkyl group such as defined above in which at least one of the hydrogens has been replaced by a halide selected from the group of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g., trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g., trifluoromethyloxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range of carbon atoms which starts with C-1 such as for instance "C-1 to C-20 alkyl," or "C-1 to C-20 fluoroalkyl," as non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

The term "alkylene" refers to hydrocarbon groups which can be a linear, branched or cyclic which has two or more attachment points (e.g., of two attachment points: methylene, ethylene, 1,2-isopropylene, a 1,4-cyclohexylene and the like; of three attachment points 1,1,1-subsituted methane,1,1,2-subsituted ethane, 1,2,4-subsituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

The term solid component as used herein refers to components which are not the solvent component e), namely in one embodiment components a), b), c), and d) and in another embodiment which includes an optional heterocylic component f), components a), b), c), d) and f).

The terms "mono and "oligomeric" alkyleneoxyalkylene" encompasses both simple alkyleneoxyalkylene moiety such as ethyleneoxyethylene ($—CH_2—CH_2—O—CH_2—CH_2—$), propyleneoxypropylene ($—CH_2—CH_2—CH_2—O—CH_2—CH_2—CH_2—$), and the like, and also oligomeric materials such as tri(ethyleneoxyethylene) ($—CH_2—CH_2—O—CH_2—CH_2—O—CH_2—CH_2—$), tri(propyleneoxypropylen), ($—CH_2—CH_2—CH_2—O—CH_2—CH_2—CH_2—OCH_2—CH_2—CH_2—$), and the like.

The term "aryl" or "aromatic groups" refers to such groups which contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents, e.g., alkyl, alkoxy, acyl or aryl groups mentioned hereinabove.

The term "Novolak" if used herein without any other modifier of structure, refers to Novolak resins which are soluble in aqueous bases such as tetramethylammonium hydroxide and the like.

The term "arylene" refers to a aromatic hydrocarbon moiety which has two or more attachment points (e.g., 2-5), this moiety may be a single benzene moiety (e.g., two attachment points 1,4-phenylene, 1,3-phenylene and 1,2-phenylene; three attachment points 1,2,4-substituted benzene, 1,3,5-substituted benzene and the like), a polycyclic aromatic moiety with two attachment points such derived from naphthalene, anthracene, pyrene and the like, or a multiple benzene rings in a chain which have two attachment point (e.g., biphenylene). In those instances where the aromatic moiety is a fused aromatic ring, these may be called fused ring arylenes, and more specifically named, for instance, naphthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5 to 10 carbon atoms.

The term "PAG," unless otherwise described, refers to a photoacid generator that can generate acid (a.k.a. photoacid) under deep UV or UV irradiation such as 200-300 nm, i-line, h-line, g-line and/or broadband irradiation. The acid may be a sulfonic acid, HCl, HBr, $HAsF_6$, and the like. It includes as non-limiting examples onium salt and other photosensitive compounds as known in the art that can photochemically generate c strong acids such as alkylsulfonic acid, arylsulfonic acid, $HAsF_6$", $HSbF_6$", HBF4", HPF6", $CF3SO_3H$, $HC(SO2CF3)_2$", $HC(SO_2CF_3)_3$, $HN(SO_2CF_3)_2$", $HB(C_6H_5)_4$, $HB(C_6F_5)_4$" bistrifluoromethylphenyl)borate acid, p-toluenesulfonic acid, $HB(CF_3)$4trihalomethyl and also photosensitive derivative of trihalomethyl heterocylic compounds which can generate a hydrogen halide such as HBr or HCl.

The term "arene" encompasses aromatic hydrocarbon moieties comprising 1 ring or 2 to 8 carbon based aromatic rings fused together.

The term "heteroarene" refers to an arene which contains 1 or more trivalent or divalent heteroatoms respectively in such a way as to retain its aromaticity. Examples of such heteroatoms are N, O, P, and S. As non-limiting examples, such heteroarenes may contain from 1 to 3 such hetero atoms.

Unless otherwise indicated in the text, the term "substituted" when referring to an aryl, alkyl, alkyloxy, fluoroalkyl, fluoroalkyloxy, fused aromatic ring, arene, heteroarene refers to one of these moieties which also contain one or more substituents, selected from the group of unsubstituted alkyl, substituted alkyl, unsubstituted aryl, alkyloxyaryl (alkyl-O-aryl-), dialkyloxyaryl ((alkyl-O—$)_2$-aryl), haloaryl, alkyloxy, alkylaryl, haloalkyl, halide, hydroxyl, cyano, nitro, acetyl, alkylcarbonyl, formyl, ethenyl ($CH_2$═CH—), phenylethenyl (Ph-CH═CH—), arylethenyl (Aryl-CH═CH), and substituents comprising ethenylenearylene moieties (e.g., Ar(—CH═CH—Ar—$)_z$ where z is 1-3. Specific, non-limiting examples of substituted aryl and substituted aryl ethenyl substituent are as follows where " " represents the point of attachment:

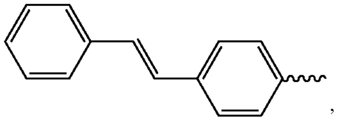

,

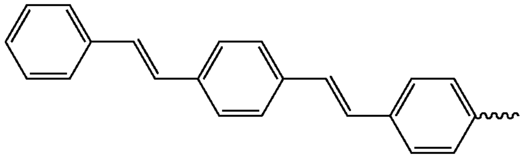

and

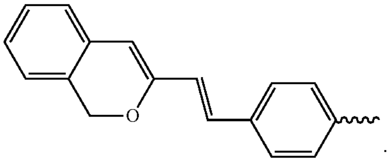

.

The term substituted aryl, and substituted ethenyls, refers to these moieties in which the substituents is selected from any of the substituents described herein. Similarly, the term "unsubstituted" refers to these same moieties, wherein no substituents apart from hydrogen is present.

In one of its aspects, this invention relates to a composition consisting essentially of components a), b), c), d) and e) or consist essentially of components a), b), c), d), e) and f) wherein:

Component a) is a blend of two Novolak polymers having structures (I) and (II); wherein $R_1$ to $R_9$ are individually selected from a C-1 to C-4 alkyl and x, y and z represent the mole % based on total moles of repeat units in the polymer of structure (I); k, l and m represent the mole % based on total moles of repeat units in the polymer of structure (II) and further wherein x ranges from about 10 to about 20 mole %, y ranges from about 50 to about 60 mole %, z ranges from about 30 to about 40 mole %, k ranges from about 10 to about 20 mole %, l ranges from about 40 to about 50 mole %, m ranges from about 30 to about 40 mole %, and further wherein for structure (I) the sum of x, y and z is 100 mole %, and in structure (II) the sum of k, l and m is 100 mole %. And further where the wt. % solid of, said Novolak polymers of structure (I) and (II), each independently range from about 23 wt. % to about 70 wt. %, preferably from about 25 wt. % to about 60 wt. % solids based upon the total weight of solid components a), b), c) and d), where the sum of the individually wt % solids values for these components is 100%.

(I)

(Ia)

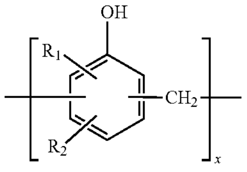

(Ib)

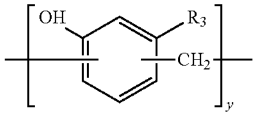

(Ic)

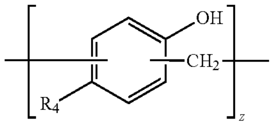

(II)

(IIa)

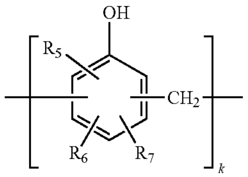

(IIb)

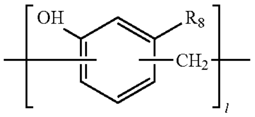

-continued (IIc)

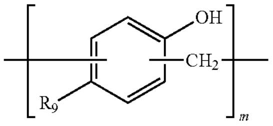

Component b) is a diazo-naphthoquinone sulfonate (DNQ-PAC) component which is a single material or a mixture of materials having general formula having structure (III) or having general formula (III-1); wherein $D_{1c}$, $D_{2c}$, $D_{3c}$, $D_{4c}$ and $D_{5c}$ are individually selected from H or a moiety having structures (IV) or (V), and further wherein in structure (III) at least one of $D_{1c}$, $D_{2c}$, $D_{3c}$ or $D_{4c}$ is a moiety having structure (IV) or (V) and in structure (III-1) at least one of $D_{1c}$, $D_{2c}$, $D_{3c}$, $D_{4c}$, $D_{5c}$ is a moiety having structure (IV) or (V). Further where this component ranges from about 9 wt. % to about 15 wt. %, preferably from about 10 wt. % to about 15 wt. % solids, (III)

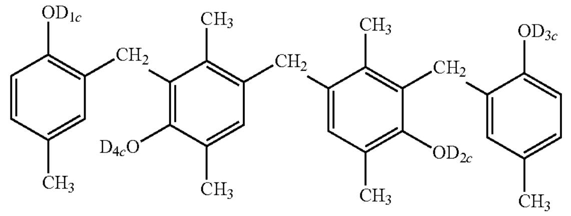

(III-1)

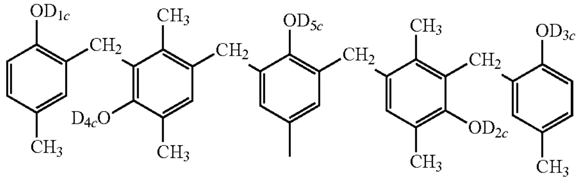

(IV)

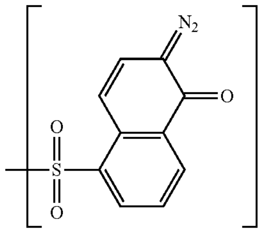

(V)

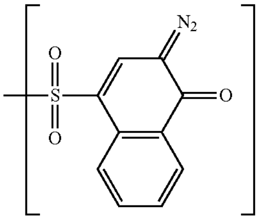

Component c) is a dissolution enhancer component comprising a polyphenolic compound which is a single compound or a mixture of at least two compounds selected from the group consisting of an oligomeric fractionated Novolak, a compounds having general structure (VI) and a compound having general structure (VII), wherein $R_{de1}$, $R_{de2}$, $R_{de3}$, $R_{de4}$ and $R_{de5}$ are individually selected from a C-1 to C-4 alkyl; and further where this component ranges from about 4 wt. % to about 15 wt. % solids.

(VI)

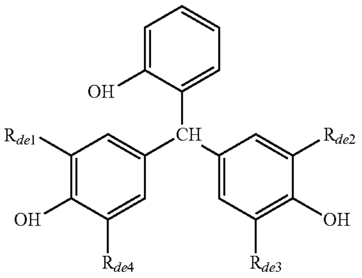

(VII)

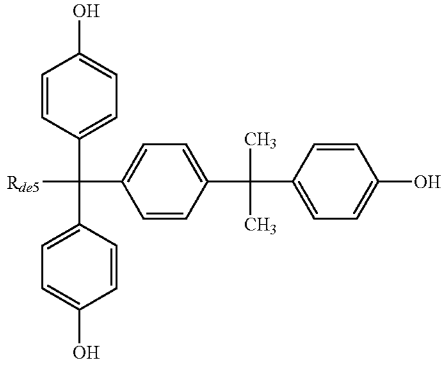

Component d) is a surfactant which ranges from about 0 wt. % to about 0.2 wt. % solids.

Component e) is an organic spin casting solvent.

Component f) is a heterocyclic thiol

Further, this composition consisting essentially of components a), b), c), d) and e) or of component a), b), c), d), e) and f) is one which is free of hexamethyl melamine type crosslinkers materials and photoacid generator.

In one embodiment said composition is one which consist essentially of components a), b), c), d) and e).

In one embodiment said composition is one which consist essentially of components a), b), c), d), e) and f).

In one embodiment said composition is one consisting of component a), b), c), d) and e).

In one embodiment said composition is one consisting of components of a), b), c), d), e) and f).

In one embodiment of the inventive composition component a) is one wherein $R_1$ to $R_9$ are methyl.

In another embodiment of the inventive composition, described herein, for the polymer of structure (I), x ranges from about 15 to about 20 mole % y ranges from about 50 to about 55 mole %, and z ranges from about 30 to about 35 mole %.

In another embodiment of the inventive composition, described herein, for the polymer of structure (I), the repeat unit of structure (Ia), whose mole % x ranges from about 10 to about 25 mole %, is comprised of a mixture of isomeric repeat units having structures (Iax1), (Iax2), (Iax3) (Iax4), (Iax5), and (Iax6), which respectively have mole % values of x1, x2, x3, x4, x5 and x6, based on the total amount of the repeat unit of structure (Ia) wherein;

x1, the mole % values of the repeat unit of structure (Iax1), ranges from 0 to about 5 mole %, x2, the mole % values of the repeat unit of structure (Iax2), ranges from 0 to about 5 mole %, x3, the mole % values of the repeat unit of structure (Iax3), ranges from about 20 to about 25 mole %, x4, the mole % values of the repeat unit of structure (Iax4), ranges from about 20 to about 25 mole %, x5, the mole % values of the repeat unit of structure (Iax5), ranges from about 20 to about 25 mole %, x6, the mole % values of the repeat unit of structure (Iax6), ranges from about 20 to about 25 mole %, where the sum of x1, x2, x3, x4, x5 and x6 adds to be from about 10 mole % to about 25 mole %, based on the Novolak polymer of structure (I) and the sum of x1, x2, x3, x4, x5, x6, y and z equals 100 mole %, based on the Novolak polymer of structure (I).

(Iax1)

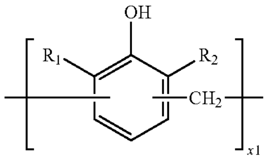

(Iax2)

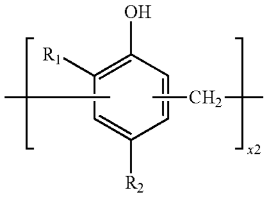

(Iax3)

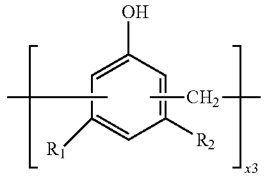

(Iax4)

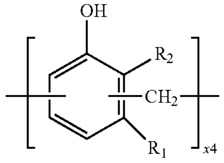

(Iax5)

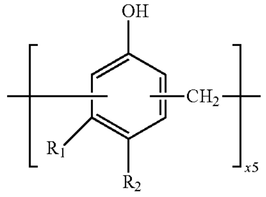

(Iax6)

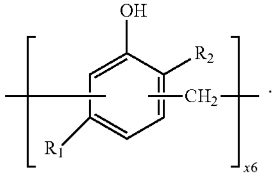

In another embodiment of the inventive composition, described herein, the polymer of structure (II), the repeat unit of structure (IIa), whose mole % k ranges from about 10 mole % to about 20 mole %, is comprised of a mixture of isomeric repeat units having structures (IIax1), (IIax2), (IIax3) (IIax4), (IIax5), and (IIax6), which respectively have mole % values of k1, k2, k3, k4, k5 and k6, where the total of these mole % values ranges from about 10 mole % to about 20 mole %, wherein;

k1, the mole % values of the repeat unit of structure (IIak1), ranges from about 10 to about 20 mole %, k2, the mole % values of the repeat unit of structure (IIak2), ranges from 0 to about 5 mole %, k3, the mole % values of the repeat unit of structure (IIak3), ranges from 0 to about 5 mole %, k4, the mole % values of the repeat unit of structure (IIak4), ranges from 0 to about 5 mole %, k5 the mole % values of the repeat unit of structure (IIak5), ranges from 0 to about 5 mole %, k6 the mole % values of the repeat unit of structure (IIak6), ranges from 0 to about 5 mole %, and further wherein the sum of k1, k2, k3, k4, k5, k6, l and m equals 100 mole %;

(IIak1)

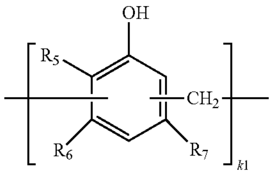

(IIak2)

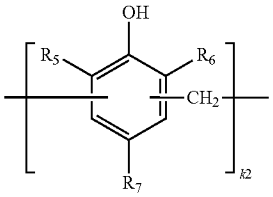

(IIak3)

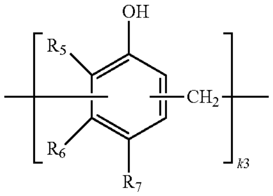

(IIak4)

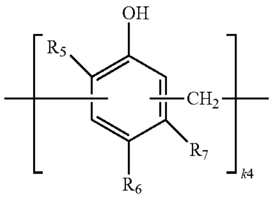

(IIak5)

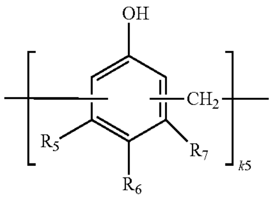

-continued

IIak6)

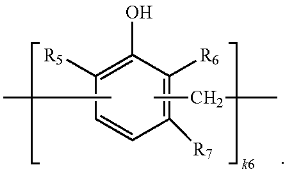

In another embodiment of the inventive composition, described, said polymer of structure (II) has the more specific structure (II-1), where k1 ranges from about 10 to about 20 mole %, l ranges from about 40 to about 50 mole %, m ranges from about 30 to about 40 mole %, and further wherein for structure (II-1) the sum of k1, l and m is 100 mole %.

(II-1)

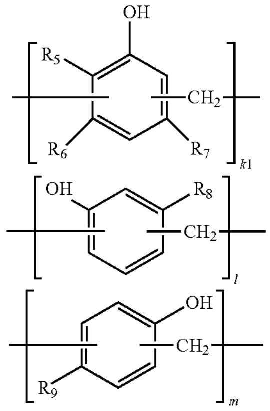

In another embodiment of the inventive composition, described herein, it is one wherein for the polymer of structure (II), k ranges from about 15 to about 20 mole %, l ranges from about 40 to about 50 mole %, and m ranges from about 35 to about 40 mole %.

In another embodiment of the inventive component a) is one wherein the wt. % solid of, said Novolak polymers of structures (I) ranges from about 23 wt. % to about 55 wt. % total solids, and the Novolak polymer of structure (II) ranges from about 25 wt. % to about 56 wt. % of total solids and where the wt. % of total solids of the combined wt. % solids of these two polymer components ranges from about 75 wt. % to about 85 wt. %. In another aspect they independently range from about 35 wt. % to about 50 wt. % of solids. In yet another aspect of this embodiment said said Novolak polymers of structures (I) ranges from about 23.5 wt. % to about 52 wt. % total solids and said Novolak polymer of structure (II) ranges from about 28 wt. % to about 55.5 wt. % total solids.

In another embodiment of the inventive composition, described herein, it is one wherein for the wherein component b), said DNQ PAC, is one wherein $D_{1c}$, $D_{2c}$, $D_{3c}$ and $D_{4c}$ are individually selected from H or a moiety having structures (IV), and further wherein at least one of $D_{1c}$, $D_{2c}$, $D_{3c}$ or $D_{4c}$ is a moiety having structure (IV).

In another embodiment of the inventive composition, described herein, component b) said DNQ PAC is one wherein $D_{1c}$, $D_{2c}$, $D_{3c}$ and $D_{4c}$ are individually selected from H or a moiety having structures (V), and further wherein at least one of $D_{1c}$, $D_{2c}$, $D_{3c}$ or $D_{4c}$ is a moiety having structure (V).

In another embodiment of the inventive composition, described herein, component c), said speed enhancer ranges from about 5 wt. % to about 15 wt. %. In another aspect of this embodiment, it ranges from about 6 wt. % to about 14 wt. %. In another aspect of this embodiment is ranges from about 6.5 wt. % to about 13 wt. %. In another aspect of this embodiment, it ranges from about 6.5 wt. % to about 12 wt. %.

In another embodiment of the inventive composition, described herein, component c), said speed enhancer is an oligomeric fractionated Novolak. In one aspect of this embodiment said speed enhancer ranges from about 5 wt. % to about 14 wt. %. In another aspect of this embodiment, it ranges from about 5 wt. % to about 13 wt. %. In another aspect of this embodiment is ranges from about 6.0 wt. % to about 12 wt. %. In another aspect of this embodiment, it ranges from about 6.5 wt. % to about 11 wt. %. In another aspect of this embodiment, it ranges from about 6.5 wt. % to about 10 wt. %. In another aspect of this embodiment, it ranges from about 6.5 wt. % to about 10 wt. %. In another aspect of this embodiment, it ranges from about 6.5 wt. % to about 9 wt. %. In another aspect of this embodiment, it ranges from about 6.5 wt. % to about 8 wt. %. In one aspect of this embodiment, it is about 7 wt. %.

In another embodiment of the inventive composition, described herein, component c), said speed enhancer is a compound of structure (VI), a compound of structure (VII) or a mixture of these. In one aspect of this embodiment in said compound of structure (VI) $R_{de1}$, $R_{de2}$, and $R_{de3}$, are all selected from the same C-1 to C-4 alkyl.

In another embodiment of the inventive composition, described herein, component c), said speed enhancer, has structure (VI). In one aspect of this embodiment said speed enhancer ranges from about 5 wt. % to about 14 wt. %. In another aspect of this embodiment, it ranges from about 5 wt. % to about 13 wt. %. In another aspect of this embodiment is ranges from about 6.0 wt. % to about 12 wt. %. In another aspect of this embodiment, it ranges from about 6.5 wt. % to about 11 wt. %. In another aspect of this embodiment, it ranges from about 6.5 wt. % to about 10 wt. %. In another aspect of this embodiment, it ranges from about 6.5 wt. % to about 10 wt. %. In another aspect of this embodiment, it ranges from about 6.5 wt. % to about 9 wt. %. In another aspect of this embodiment, it ranges from about 6.5 wt. % to about 8 wt. %. In one aspect of this embodiment, it is about 7 wt. %.

In another embodiment of the inventive composition, described herein, component c), said speed enhancer, is a mixture of different compounds which have structure (VI). In one aspect of this embodiment said speed enhancer ranges from about 5 wt. % to about 14 wt. %. In another aspect of this embodiment, it ranges from about 5 wt. % to about 13 wt. %. In another aspect of this embodiment is ranges from about 6.0 wt. % to about 12 wt. %. In another aspect of this embodiment, it ranges from about 6.5 wt. % to about 11 wt. %. In another aspect of this embodiment, it ranges from about 6.5 wt. % to about 10 wt. %. In another aspect of this embodiment, it ranges from about 6.5 wt. % to about 10 wt. %. In another aspect of this embodiment, it ranges from about 6.5 wt. % to about 9 wt. %. In another aspect of this embodiment, it ranges from about 6.5 wt. % to about 8 wt. %. In one aspect of this embodiment, it is about 7 wt. %.

In another embodiment of the inventive composition, described herein, component c) said speed enhancer has structure (VII). In one aspect of this embodiment, said speed enhancer ranges from about 5 wt. % to about 15 wt. %. In another aspect of this embodiment, it ranges from about 6 wt. % to about 14 wt. %. In another aspect of this embodiment is ranges from about 7 wt. % to about 13 wt. %. In another aspect of this embodiment, it ranges from about 8 wt. % to about 12.5 wt. %.%. In another aspect of this embodiment, it ranges from about 8 wt. % to about 12.5 wt. %. In another aspect of this embodiment, it ranges from about 9 wt. % to about 12.5 wt. %. In another aspect of this embodiment, it ranges from about 10 wt. % to about 12.5 wt. %. In another aspect of this embodiment, it ranges from about 11 wt. % to about 12.5 wt. %. In another aspect of this embodiment, it is about 12 wt. %.

In another embodiment of the inventive composition, described herein, component c), said speed enhancer, is a mixture of different compounds which have structure (VII). In another aspect of this embodiment, it ranges from about 6 wt. % to about 14 wt. %. In another aspect of this embodiment is ranges from about 7 wt. % to about 13 wt. %. In another aspect of this embodiment, it ranges from about 8 wt. % to about 12.5 wt. %.%. In another aspect of this embodiment, it ranges from about 8 wt. % to about 12.5 wt. %. In another aspect of this embodiment, it ranges from about 9 wt. % to about 12.5 wt. %. In another aspect of this embodiment, it ranges from about 10 wt. % to about 12.5 wt. %. In another aspect of this embodiment, it ranges from about 11 wt. % to about 12.5 wt. %. In another aspect of this embodiment, it is about 12 wt. %.

In another embodiment of the inventive composition, described herein, component c), said speed, is a mixture of speed enhancers of structures (VI) and (VII).

In another embodiment of the inventive composition, described herein, component c), said speed enhancer, is either selected from one having structure (VIa), or structure (VIIa) or is a mixture of the speed enhancers of structures (VIa) and (VIIa). In another aspect of this embodiment, it has structure (VIa). In another aspect of this embodiment said speed enhancer has structure (VIIa). In another aspect of this embodiment said speed enhancer is a mixture of structures (VIa) and (VIIa).

In another embodiment of the inventive composition, described herein, component c), said speed enhancer, has structure (VIa) and it ranges from about 5 wt. % to about 14 wt. %. In another aspect of this embodiment, it ranges from about 5 wt. % to about 13 wt. %. In another aspect of this embodiment is ranges from about 6.0 wt. % to about 12 wt. %. In another aspect of this embodiment, it ranges from about 6.5 wt. % to about 11 wt. %. In another aspect of this embodiment, it ranges from about 6.5 wt. % to about 10 wt. %. In another aspect of this embodiment, it ranges from about 6.5 wt. % to about 10 wt. %. In another aspect of this embodiment, it ranges from about 6.5 wt. % to about 9 wt. %. In another aspect of this embodiment, it ranges from about 6.5 wt. % to about 8 wt. %. In one aspect of this embodiment, it is about 7 wt. %. In another embodiment of the inventive composition, described herein, component c), said speed enhancer, has structure (VIIa) and it ranges from about 6 wt. % to about 14 wt. %. In another aspect of this embodiment is ranges from about 7 wt. % to about 13 wt. %. In another aspect of this embodiment, it ranges from about 8 wt. % to about 12.5 wt. %.%. In another aspect of this embodiment, it ranges from about 8 wt. % to about 12.5 wt. %. In another aspect of this embodiment, it ranges from about 9 wt. % to about 12.5 wt. %. In another aspect of this embodiment, it ranges from about 10 wt. % to about 12.5 wt. %. In another aspect of this embodiment, it ranges from about 11 wt. % to about 12.5 wt. %. In another aspect of this embodiment, it is about 12 wt. %.

(VIa)

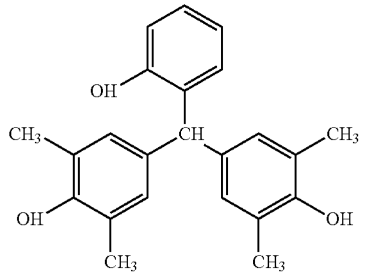

4,4′-((2-hydroxyphenyl)methylene)bis(2,6-dimethylphenol)

(VIIa)

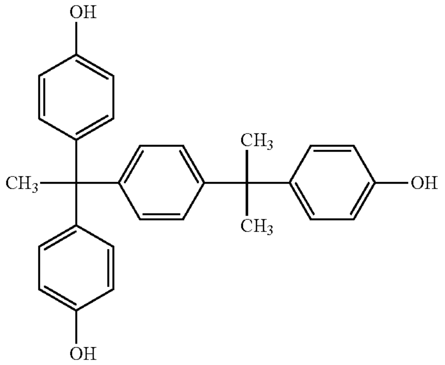

4,4′-(1-(4-(2-(4-hydroxyphenyl)propan-2-yl)phenyl)ethane-1,1-diyl)diphenol

Component d) Surfactant

In another embodiment of the inventive composition, described herein, component d) for said surfactant there is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Chemical Co. Ltd.).

In another embodiment of the inventive composition, described herein, the total weight of components a), b), c) and d), or a), b), c), d) and f), when combined with the solvent component e), results in a wt % of total of these solid components in the solvent which ranges from about 30% to about 40%.

In another embodiment of the above composition, component e), organic spin casting solvent, comprises one or more of butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether (PGME), propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate(PGMEA), propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether and gamma butyrolactone. In one aspect of this embodiment the solvent component comprises propylene glycol monomethyl ether (PGME). In another aspect of this embodiment the solvent component comprises propylene glycol monomethyl ether acetate (PGMEA).

Component f) Heterocyclic Thiols

In one embodiment of the above-described inventive compositions it further comprises at least one optional heterocyclic thiol component. In one aspect of this embodiment said heterocyclic thiol component is at least one heterocyclic thiol compound comprising a ring structure chosen from the general structures (H1), (H2) or (H3), or tautomers thereof; and said ring structure is a single ring structure having from 4 to 8 atoms, or a multi ring structure having from 5 to 20 atoms; and wherein the single ring structure, or the multi ring structure comprises an aromatic, non-aromatic, or heteroaromatic ring. In said structure (H1), Xt is selected from the group consisting of N(Rt3), $C(Rt_1)(Rt_2)$, O, S, Se, and Te. In said structure (H2), Y is selected from the group consisting of $C(Rt_3)$ and N. In said structure (H3), Z is selected from the group consisting of $C(Rt_3)$ and N. In these structures $Rt_1$, $Rt_2$, and $Rt_3$ are independently selected from the group consisting of H, a substituted alkyl group having 1 to 8 carbon atoms, an unsubstituted alkyl group having 1 to 8 carbon atoms, a substituted alkenyl group having 2 to 8 carbon atoms, unsubstituted alkenyl group having 2 to 8 carbon atoms, a substituted alkynyl group having 2 to 8 carbon atoms, unsubstituted alkynyl group having 2 to 8 carbon atoms, a substituted aromatic group having 6 to 20 carbon atoms, a substituted heteroaromatic group having 3 to 20 carbon atoms, unsubstituted aromatic group having 6 to 20 carbon atoms and unsubstituted heteroaromatic group having 3 to 20 carbon atoms. In one embodiment, said heterocyclic thiol compound is present from about 0.5 wt. % to about 1.5 wt. % total solids.

(H1)

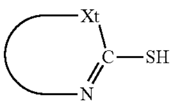

(H2)

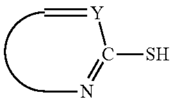

-continued (H3)

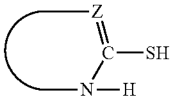

In another embodiment wherein said inventive composition comprises at least one heterocyclic thiol chosen from the above general structures (H1), (H2) or (H3), or tautomers thereof these may be chosen without limitation from substituted or unsubstituted triazole thiols, substituted or unsubstituted imidazole thiols, substituted or unsubstituted triazine thiols, substituted or unsubstituted mercapto pyrimidines, substituted or unsubstituted thiadiazole-thiols, substituted or unsubstituted indazole thiols, tautomers thereof or combinations thereof. Substituents may include, without limitation, saturated or unsaturated hydrocarbon groups, substituted or unsubstituted aromatic rings, aliphatic, aromatic or heteroaromatic alcohols, amines, amides, imides carboxylic acids, esters, ethers, halides, and the like. Such substituents may be used in concert with the heterocyclic thiol to improve solubility, to modify interaction with the substrate, to enhance exposure to light or to act as an antihalation dye.

In another embodiment wherein said inventive composition comprises at least one heterocyclic thiol chosen from the above general structures (H1), (H2) or (H3), or tautomers thereof such heterocyclic thiols may be chosen, without limitation from the following compounds (H4) to (H23) in unsubstituted or substituted form:

(H4)

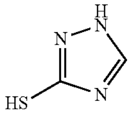

1H-1,2,4-triazole-3-thiol (H5)

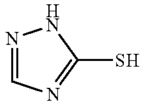

1H-1,2,4-triazole-5-thiol (H6)

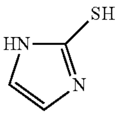

1H-imidazole-2-thiol (H7)

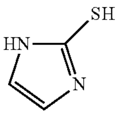

1H-imidazole-2-thiol (H8)

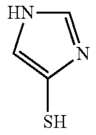

1H-imidazole-4-thiol

-continued (H9)

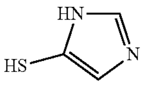

1H-imidazole-5-thiol (H10)

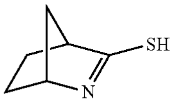

2-azabicyclo[2.2.1]hept-2-ene-3-thiol (H11)

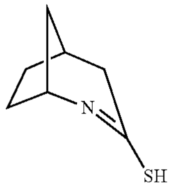

2-azabicyclo[3.2.1]oct-2-ene-3-thiol (H12)

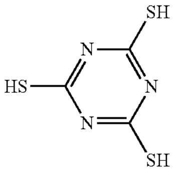

1,3,5-triazine-2,4,6-trithiol (H13)

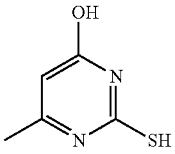

2-mercapto-6-methylpyrimidin-4-ol (H14)

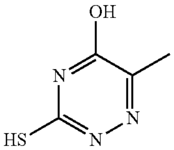

3-mercapto-6-methyl-1,2,4-triazin-5-ol (H15)

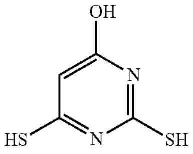

2-mercaptopyrimidine-4,6-diol (H16)

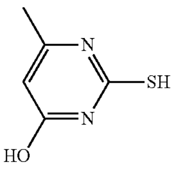

2-mercapto-6-methylpyrimidin-4-ol

-continued (H17)

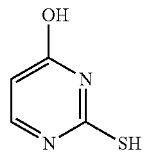

2-mercaptopyrimidin-4-ol (H19)

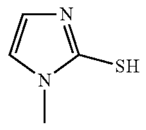

1-methyl-1H-imidazole-2-thiol (H20)

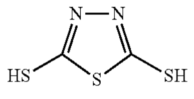

1,3,4-thiadiazole-2,5-dithiol (H21)

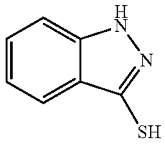

1H-indazole-3-thiol (H22)

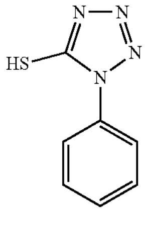

1-phenyl-1H-tetrazole-5-thiol (H23)

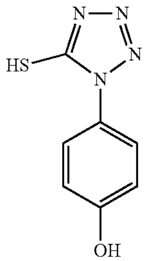

4-(5-mercapto-1H-tetrazol-1-yl)phenol

In another aspect of the embodiment wherein said inventive composition comprises at least one heterocyclic thiol having general structures (H1), (H2) or (H3), or tautomers thereof, such heterocyclic thiols may be chosen from thiouracil derivatives such as 2-thiouracil. These include, without limitation, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thioracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradodecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-tert-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil, 1-phenyl-1H-tetrazole-5-thiol, 4-(5-mercapto-1H-tetrazol-1-yl) phenol, tautomers thereof and combinations thereof.

In another embodiment wherein said inventive composition comprises at least one heterocyclic thiol chosen from the above general structures (H1), (H2) or (H3), or tautomers thereof such heterocyclic thiols may be selected from the group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof.

In another embodiment wherein said inventive composition comprises component g), said heterocyclic thiol, this is at least one heterocyclic thiol chosen from the above general structures (H1), (H2) or (H3), or tautomers thereof such heterocyclic thiols may be selected from the group consisting of 1,3,5-triazine-2,4,6-trithiol, 2-mercapto-6-methylpyrimidin-4-ol, 3-mercapto-6-methyl-1,2,4-triazin-5-ol, 2-merc aptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, 1-phenyl-1H-tetrazole-5-thiol, 4-(5-mercapto-1H-tetrazol-1-yl)phenol, tautomers thereof and combinations thereof.

In another aspect of this composition where it comprises at least one heterocyclic thiol chosen from the above general structures (H1), (H2) or (H3) as described herein, said heterocyclic thiol is present at a loading ranging from about 0.001 wt. % to about 1.5 wt. % of total solids. In another aspect of this embodiment, this heterocyclic thiol ranges from about 0.010 wt. % to about 1.5 wt. % of total solids. In another aspect of this embodiment this heterocyclic thiol ranges from about 0.1 wt. % to about 1.5 wt. % of total solids. In another aspect of this embodiment this heterocyclic thiol ranges from about 0.2 wt. % to about 1.5 wt. % of total solids. In another aspect of this embodiment this heterocyclic thiol ranges from about 0.3 wt. % to about 1.5 wt. % of total solids. In another aspect of this embodiment this heterocyclic thiol compound ranges from about 0.4 wt.

% to about 1.5 wt. % of total solids. In another aspect of this embodiment this heterocyclic thiol ranges from about 0.6 wt. % to about 1.4 wt. % of total solids. In another aspect of this embodiment this heterocyclic thiol ranges from about 0.7 wt. % to about 1.3 wt. % of total solids. In another aspect of this embodiment said heterocyclic thiol compound ranges from about 0.8 wt. % to about 1.2 wt. % of total solids. In another aspect of this embodiment said heterocyclic thiol compound ranges from about 0.9 wt. % to about 1.1 wt. % of total solids. In another aspect of this embodiment said heterocyclic thiol compound is about 1 wt. % of total solids.

In another aspect of this composition where it comprises at least one heterocyclic thiol chosen from the above general structures (H1), (H2) or (H3) as described herein, this heterocyclic thiol compound, as described herein, ranges from about 0.01 wt. % to about 0.49 wt. % of total solids. In another aspect of this embodiment this heterocyclic thiol compound ranges from about 0.04 wt. % to about 0.49 wt. % of total solids. In another aspect of this embodiment this heterocyclic thiol compound ranges from about 0.08 wt. % to about 0.49 wt. % of total solids. In another aspect of this embodiment this heterocyclic this thiol compound ranges from about 0.09 wt. % to about 0.49 wt. % of total solids. In another aspect of this embodiment this heterocyclic thiol compound ranges from about 0.10 wt. % to about 0.49 wt. % of total solids. In another aspect of this embodiment this heterocyclic thiol compound ranges from about 0.15 wt. % to about 0.49 wt. % of total solids. In another aspect of this embodiment this heterocyclic thiol compound ranges from 0.20 wt. % to about 0.49 wt. % of total solids. In another aspect of this embodiment this heterocyclic thiol compound ranges from 0.25 wt. % to about 0.48 wt. % of total solids. In another aspect of this embodiment this heterocyclic thiol compound ranges from 0.30 wt. % to about 0.47 wt. % of total solids. In another aspect of this embodiment this heterocyclic thiol compound ranges from 0.30 wt. % to about 0.47 wt. % of total solids. In another aspect of this embodiment this heterocyclic thiol compound ranges from 0.30 wt. % to about 0.49 wt. % of total solids. In another aspect of this embodiment this heterocyclic thiol compound ranges from 0.30 wt. % to about 0.45 wt. % of total solids. In another aspect of this embodiment this heterocyclic thiol compound ranges from 0.30 wt. % to about 0.45 wt. % of total solids. In another aspect of this embodiment this heterocyclic thiol compound ranges from 0.30 wt. % to about 0.45 wt. % of total solids. In another aspect of this embodiment this heterocyclic thiol compound ranges from 0.30 wt. % to about 0.44 wt. % of total solids. In another aspect of this embodiment this heterocyclic thiol compound ranges from 0.30 wt. % to about 0.43 wt. % of total solids. In another aspect of this embodiment this heterocyclic thiol compound ranges from 0.30 wt. % to about 0.42 wt. % of total solids. In another aspect of this embodiment this heterocyclic thiol compound ranges from 0.30 wt. % to about 0.41 wt. % of total solids. In another aspect of this embodiment this heterocyclic thiol compound ranges from 0.30 wt. % to about 0.40 wt. % of total solids. In another aspect of this embodiment this heterocyclic thiol compound is about 0.35 wt. % of total solids.

Component e) Organic Spin Casting Solvent

The photosensitive composition disclosed herein may be dissolved in an organic solvent. Examples of suitable organic solvents include, without limitation, butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate (PGMEA), propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, gamma butyrolactone. These solvents may be used singly or in a mixture of two or more.

Other Optional Components

In one embodiment of the above-described inventive compositions it further comprises at least one optional surface leveling agents may include surfactants. In this embodiment, there is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Chemical Co. Ltd.). When a surfactant is present in one embodiment it ranges from about 0.01 wt. % to about 0.3 wt. % of total solids Processing Another aspect of this invention is a process of coating any one of the compositions described herein on a substrate.

Another aspect of this invention is a process of imaging a resist comprising the steps;

i) coating any one of the compositions described herein on a substrate to form a resist film;
ii) selectively exposing the resist film to UV light using a mask to form a selectively exposed resist film;
iii) developing the selectively exposed film to form a positively imaged resist film over the substrate.

Another aspect of this invention is a process of imaging a resist comprising the steps;

ia) coating any one of the compositions described herein on a substrate to form a resist film;
iia) selectively exposing the resist film to UV light using a mask to form a selectively exposed resist film;

iiia) baking the selectively exposed resist film to form a baked selectively exposed resist film;

iva) developing the selectively exposed and baked resist film to form a positively imaged resist film over the substrate.

Another aspect of this invention is the use of the compositions described herein for coating a substrate or for preparing an imaged resist film on a substrate.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Coating of Formulations:

All formulations were tested on 6 or 8" diameter Si and Cu wafers. The Si wafers were rehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The resist coatings were prepared by spin coating the resist samples and applying a soft bake for 120 seconds at 110 °C on standard wafer track hot plate in contact mode. The spin speed was adjusted to obtain 5 to 10-microns thick resist films. All film thickness measurements were conducted on Si wafers using optical measurements.

Imaging:

The wafers were exposed on SUSS MA200 CC Mask Aligner or on ASML 250 i-line stepper. The resist was waited for 10-60 mins without post exposure baking and then puddle developed for 120 to 360 seconds in AZ 300 MIF (0.26N aqueous solution of tetramethyl ammonium hydroxide=TMAH) at 23 °C. The developed resist images were inspected using Hitachi S4700 or AMRAY 4200L electron microscopes.

Materials

SPN400 Slow is a m-cresol/p-cresol/dimethylphenol/formaldehyde Novolak polymer, sold under the name of Alnovol SPN 400 44% PGMEA, supplied by Allnex USA Inc. The average molecular weight of this Novolak is MW=18,282. The dissolution rate of the Novolak is 63 Å/S in 0.26N aqueous TMAH developer. MIPHOTO NOVOL T106S is a m-cresol/p-cresol/trimethylphenol/formaldehyde Novolak polymer, sold under the name of MIPHOTO NOVOL T106S, supplied by Miwon Commercial Co., Ltd. The average molecular weight of this Novolak is MW=8,136, PDI=6.51. The dissolution rate of the Novolak is 309 Å/S in 0.26N aqueous TMAH developer. MIPHOTO PAC BP524 is a DNQ PAC sold under this name by Miwon Commercial Co., Ltd. It is a mixture of materials having general formula (III) wherein D1c, D2c, D3c and D4c are individually selected from H or a moiety having structure (IV), where at least one of D1c, D2c, D3c, or D4c is a moiety having structure (IV).

(III)

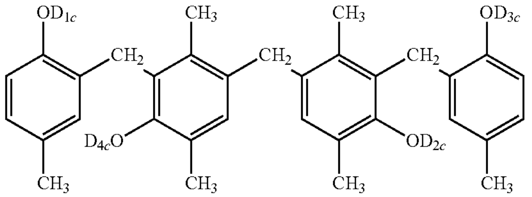

(IV)

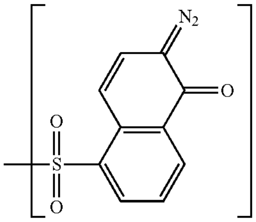

BI26X-SA is Bis(4-hydroxy-3,5-dimethylphenyl)-2-hydroxyphenylmethane, a dissolution enhancer sold under this name by Asahi Yukizai Co., Ltd.

TPPA (4,4'-(1-(4-(2-(4-hydroxyphenyl)propan-2-yl)phenyl)ethane-1,1-diyl)diphenol) sold by Millipore Sigma USA a subsidiary of Merck KGaA (Darmstadt, Germany).

APS-437 (a.k.a. KF-353A) is a surfactant from Shinetsu, (Tokyo, Japan).

PGMEA (1-Methoxy-2-propanyl acetate), the solvent used for photoresist formulation examples was obtained from Sigma-Aldrich a subsidiary of Merck KGaA (Darmstadt, Germany).

AZ 300MIF developer was obtained from EMD Performance Materials Corp, a subsidiary of Merck KGaA (Darmstadt, Germany) (a.k.a. 2.38% Tetramethylammonium hydroxide (TMAH)).

All other chemical unless otherwise not were obtained from Millipore Sigma USA a subsidiary of Merck KGaA (Darmstadt, Germany).

Molecular weights of polymers were measured with Gel Permeation Chromatography (GPC).

The Novolak/DNQ photoresist composition comprises two Novolak resins, one DNQ photoactive compound, one dissolution enhancer, one surfactant, and one solvent. The two Novolak resins utilized in the photoresist composition consist of different monomers and composition ratios. Photoresists were spin-coated on silicon wafers, and soft-baked on a hot plate and then exposed by the gh-line or i-line stepper. The exposed wafers were then developed to remove the exposed areas using AZ® 300MIF developer. Finally, the wafers were rinsed with DI water and then spin dried to obtain photoresist patterns.

Comparative Example 1 (H476-SPN400 Slow, BP524, BI26X-SA, APS437, PGMEA)

A Novolak/DNQ photoresist composition was made by dissolving 42.7% PGMEA solution of Novolak resin SPN400 Slow (64.54 grams), 4.69 grams of MIPHOTO PAC BP524, 2.76 grams of dissolution enhancer BI26X-SA, 10.0% PGMEA solution of surfactant APS-437 (also called KF-353A, 0.42 grams) in propylene glycol monomethyl ether acetate (PGMEA) 28.02 grams. Thus, a positive photoresist composition with a solid content of 35.0% by weight was prepared. The photoresist composition was spin-coated on a silicon wafer substrate, soft-baked at 110 °C/120 sec to obtain a film with 5.0 μm thickness. Next, through a pattern mask for measuring resolution, the coated film was exposed by an ASML i-line stepper (NA=0.48, Sigma=0.55), followed by post-exposure-bake (PEB) of 100 °C/60 sec, and then developed with AZ® 300MIF developer (2.38% TMAH, tetramethylammonium hydroxide aqueous solution) for 60 sec with 3 puddles (3×60 sec). The 1.0 μm L/S (line/space) resolved at 360 mJ/cm$^2$ showed a top CD of 0.551 μm and bottom CD of 1.151 μm.

Solid % of Raw Materials—
- Novolak Resin PN400 Slow: 78.6458%
- MIPHOTO PAC BP524: 13.3698%
- Speed Enhancer BI26X-SA: 7.8646%
- Surfactant APS437(KF353A): 0.1199%
- Solid Content: 35.04%

Comparative Example 2 (H457-T106S, BP524, BI26X-SA, APS437, PGMEA)

A Novolak/DNQ photoresist composition was made by mixing 30.0% PGMEA solution of Novolak resin MIPHOTO NOVOL T106S (94.61 grams), 3.97 grams of MIPHOTO PAC BP524, 1.42 grams of dissolution enhancer BI26X-SA, 10.0% PGMEA solution of surfactant APS-437 (also called KF-353A, 0.41 grams). Thus, a positive photoresist composition with a solid content of 33.82% by weight was prepared. This composition was evaluated as the same manner as in Comparative Example 1. The 1.0 μm L/S (line/space) resolved at 100 mJ/cm$^2$ showed a top CD of 0.832 μm and bottom CD of 0.716 μm.

Solid % of Raw Materials—
- MIPHOTO NOVOL T106S: 83.9329%
- MIPHOTO PAC BP524: 11.7506%
- Speed Enhancer BI26X-SA: 4.1967%
- Surfactant APS437(KF353A): 0.1199%
- Solid Content: 33.8153%

Example 1 (Comparative Example 1/Comparative Examples 2=66/34, Solid Content Ratio)

A Novolak/DNQ photoresist composition was made by mixing Comparative Example 1 (32.53 grams) and Comparative Example 2 (17.37 grams). Thus, a positive photoresist composition with a solid content of 34.50% by weight was prepared. This composition was evaluated as the same manner as in Comparative Example 1. The 1.0 μm L/S (line/space) resolved at 240 mJ/cm$^2$ showed a top CD of 0.725 μm and bottom CD of 1.180 μm.

Solid % of Raw Materials—
- Novolak Resin SPN400 Slow: 51.9063%
- Novolak Resin MIPHOTO NOVOL T106S: 28.5371%
- MIPHOTO PAC BP524: 12.8191%
- Speed Enhancer BI26X-SA: 6.6176%
- Surfactant APS437(KF353A): 0.1198%
- Solid Content: 34.50%

Example 2 (Comparative Example 1/Comparative Examples 2=50/50, Solid Content Ratio)

A Novolak/DNQ photoresist composition was made by mixing Comparative Example 1 (24.55 grams) and Comparative Example 2 (25.45 grams). Thus, a positive photoresist composition with a solid content of 34.38% by weight was prepared. This composition was evaluated as the same manner as in Comparative Example 1. The 1.0 μm L/S (line/space) resolved at 200 mJ/cm$^2$ showed a top CD of 0.764 μm and bottom CD of 1.112 μm.

Solid % of Raw Materials—
- Novolak Resin SPN400 Slow: 39.323%
- Novolak Resin MIPHOTO NOVOL T106S: 41.966%
- MIPHOTO PAC BP524: 12.56%
- Speed Enhancer BI26X-SA: 6.031%
- Surfactant APS437(KF353A): 0.119%
- Solid Content: 34.38%

Example 3 (Comparative Example 1/Comparative Examples 2=34/66, Solid Content Ratio)

A Novolak/DNQ photoresist composition was made by mixing Comparative Example 1 (16.60 grams) and Comparative Example 2 (33.40 grams). Thus, a positive photoresist composition with a solid content of 34.18% by weight was prepared. This composition was evaluated as the same manner as in Comparative Example 1. The 1.0 μm L/S (line/space) resolved at 140 mJ/cm$^2$ showed a top CD of 0.861 μm and bottom CD of 1.151 μm.

Solid % of Raw Materials—
- Novolak Resin SPN400 Slow: 26.7396%
- Novolak Resin MIPHOTO NOVOL T106S: 55.3955%
- MIPHOTO PAC BP524: 12.3012%
- Speed Enhancer BI26X-SA: 5.4438%
- Surfactant APS437(KF353A): 0.1199%
- Solid Content: 34.18%

Example 4

A Novolak/DNQ photoresist composition was made by mixing 42.7% PGMEA solution of Novolak resin SPN400 Slow (21.15 grams), 30.01% PGMEA solution of Novolak resin MIPHOTO NOVOL T106S (66.21 grams), 3.71 grams of MIPHOTO PAC BP524, 4.47 grams of dissolution enhancer TPPA, 0.375 grams of adhesion additive PMT, 10.0% PGMEA solution of surfactant APS-437 (also called KF-353A, 0.446 grams) and 3.636 grams of PGMEA. Thus, a positive photoresist composition with a solid content of 37.5% by weight was prepared.

Solid % of Raw Materials—
- Novolak Resin SPN400 Slow: 24.088%
- Novolak Resin MIPHOTO NOVOL T106S: 52.987%
- MIPHOTO PAC BP524: 9.899%
- Speed Enhancer TPPA: 11.907%
- Adhesion Additive PMT: 1.00%
- Surfactant APS437(KF353A): 0.119%
- Solid Content: 37.5%

FIG. 1 compares the Depth-of-Focus (DOF) curves of Example 2 and Comparative Example 1 are juxtaposed in a graph which highlights the unexpected improvement of our new formulations as described herein.

Figure 2:
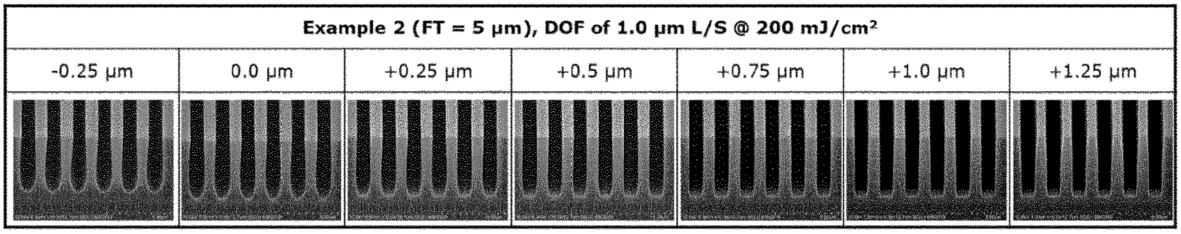
FIG. 2 SEM study of depth of Focus (DOF) of Example 2@5 μm film thickness (FT).

FIG. 2 shows a scanning electron micrograph (SEM) study demonstrating the good dept of focus of (DOF) of Example 2 when coated as a 5 μm film thickness and imaged.

Figure 3:
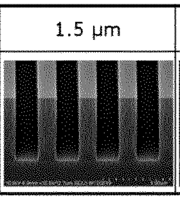
FIG. 3 Linearity of Linearity for Example 2@5 μm FT
Figure 3:
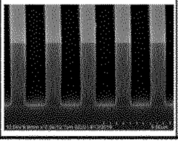
Figure 3:
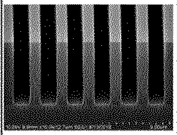
Figure 3:
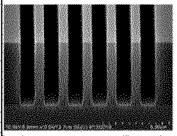
Figure 3:
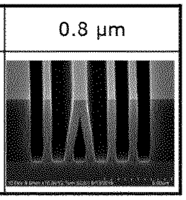

FIG. 3 shows a scanning electron micrograph (SEM) study demonstrating the good linearity of Example 2 when coated as a 5 μm film thickness and imaged.

Figure 4:
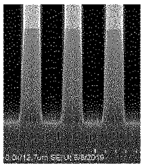
Figure 4:
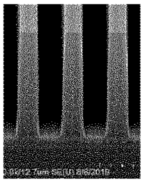
Figure 4:
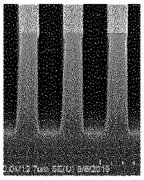
Figure 4:
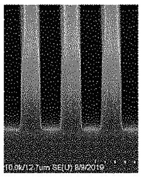
Figure 4:
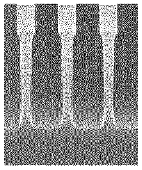

FIG. 4 shows Table 1, which gives a summary of the lithographic performance of Examples 1, 2 and 3 compared to Comparative Examples 1, which again highlights the unexpected improvement of our new formulations as described herein.

What is claimed is:

1. A composition consisting essentially of components a), b), c), d), and e) or consisting essentially of a), b), c), d), e) and f)

a) a blend of two Novolak polymers having structures (I) and (II); wherein $R_1$ to $R_9$ are individually selected from a C-1 to C-4 alkyl and x, y and z represent the mole % based on total moles of repeat units in the polymer of structure (I); k, l and m represent the mole % based on total moles of repeat units in the polymer of structure (II) and further wherein x ranges from about 10 to about 20 mole %, y ranges from about 50 to about 60 mole %, z ranges from about 30 to about 40 mole %, k ranges from about 10 to about 20 mole %, l ranges from about 40 to about 50 mole %, m ranges from about 30 to about 40 mole %, and further wherein for structure (I) the sum of x, y and z is 100 mole %, and in structure (II) the sum of k, l and m is 100 mole %;

b) a diazo-naphthoquinone sulfonate (DNQ-PAC) component which is a single material or a mixture of materials having general formula having structure (III) or having general formula (III-1); wherein $D_{1c}$, $D_{2c}$, $D_{3c}$, $D_{4c}$ and $D_{5c}$ are individually selected from H or a moiety having structures (IV) or (V), and further wherein in structure (III) at least one of $D_{1c}$, $D_{2c}$, $D_{3c}$ or $D_{4c}$ is a moiety having structure (IV) or (V) and in structure (III-1) at least one of $D_{1c}$, $D_{2c}$, $D_{3c}$, $D_{4c}$, $D_{5c}$ is a moiety having structure (IV) or (V);

c) is a dissolution enhancer component comprising a polyphenolic compound which is a single compound or a mixture of at least two compounds selected from the group consisting of an oligomeric fractionated Novolak, a compound having general structure (VI) and a compound having general structure (VII), wherein $R_{de1}$, $R_{de2}$, $R_{de3}$, $R_{de4}$ and $R_{de5}$ are individually selected from a C-1 to C-4 alkyl;

d) a surfactant e) an organic spin casting solvent;

wherein the wt. % solids range of components a), b), c) and d), using a wt. % solids calculated from the total weight of components a), b), c) and d), which combined add up to 100 wt. % solids are as follows:

component a) is one wherein the wt. % solid of said Novolak polymers of structure (I) and (II) each independently range from about 23 wt. % to about 60 wt. %, component b) ranges from about 9 wt. % to about 15 wt. %, component c) ranges from about 4 wt. % to about 15 wt. % and component d) ranges from about 0 wt. % to about 0.2 wt. %;

and further this composition is free of hexamethyl melamine crosslinkers and photoacid generators, and f) an optional heterocyclic thiol component (I)

(Ia)

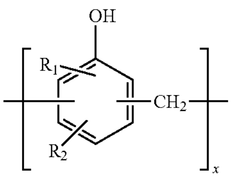

(Ib)

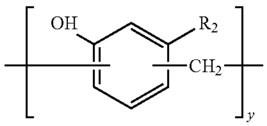

-continued (Ic)

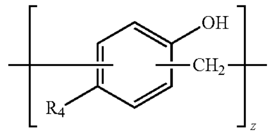

(II)

(IIa)

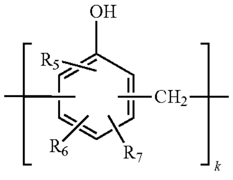

(IIb)

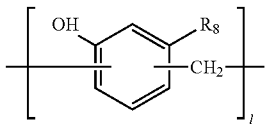

(IIc)

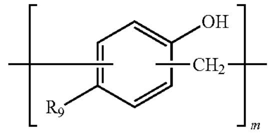

(III)

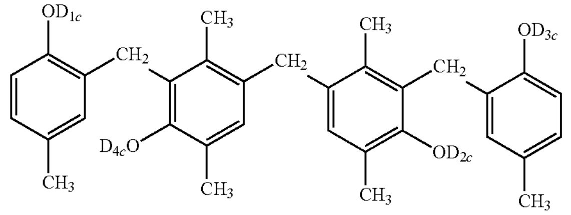

(III-1)

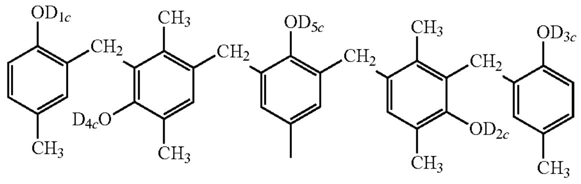

(IV)

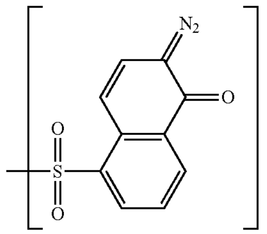

(V)

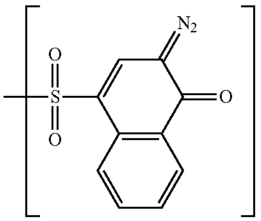

-continued (VI)

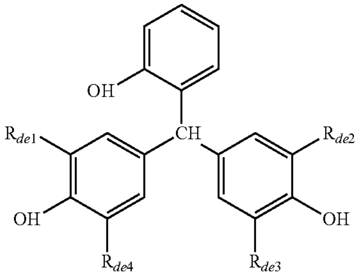

(VII)

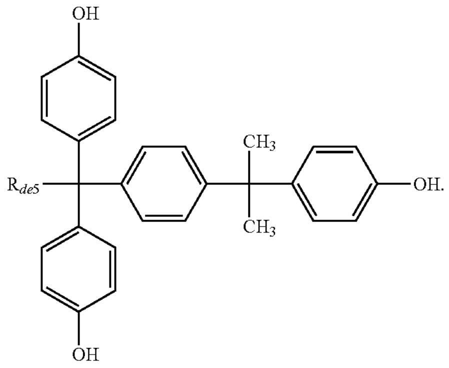

2. The composition of claim 1 consisting essentially of components a) b), c), d), e) and f).

3. The composition of claim 1, wherein $R_1$ to $R_9$ are methyl.

4. The composition of claim 1, wherein in the polymer of structure (I), x ranges from about 15 to about 20 mole %, y ranges from about 50 to about 55 mole %, and z ranges from about 30 to about 35 mole %.

5. The composition of claim 1, wherein in the polymer of structure (I), the repeat unit of structure (Ia), whose mole % x ranges from about 10 to about 20 mole %, is comprised of a mixture of isomeric repeat units having structures (Iax1), (Iax2), (Iax3) (Iax4), (Iax5), and (Iax6), which respectively have mole % values of x1, x2, x3, x4, x5 and x6, based on the total amount of the repeat unit of structure (Ia) wherein;

x1, the mole % values of the repeat unit of structure (Iax1), ranges from 0 to about 5 mole %, x2, the mole % values of the repeat unit of structure (Iax2), ranges from 0 to about 5 mole %, x3, the mole % values of the repeat unit of structure (Iax3), ranges from about 20 to about 25 mole %, x4, the mole % values of the repeat unit of structure (Iax4), ranges from about 20 to about 25 mole %, x5, the mole % values of the repeat unit of structure (Iax5), ranges from about 20 to about 25 mole %, x6, the mole % values of the repeat unit of structure (Iax6), ranges from about 20 to about 25 mole %, and further wherein the sum of x1, x2, x3, x4, x5 and x6, based on the Novolak polymer of structure (I) adds to be from about 10 mole % to about 25 mole % and the sum of x1, x2, x3, x4, x5, x6, y and z, based on the Novolak polymer of structure (I) equals 100 mole %;

(Iax1)

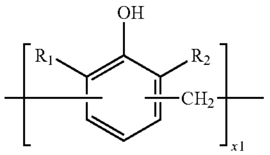

(Iax2)

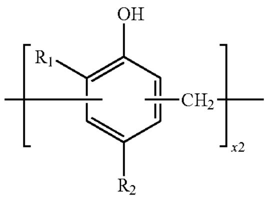

(Iax3)

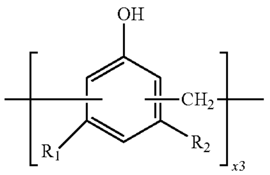

(Iax4)

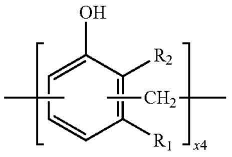

(Iax5)

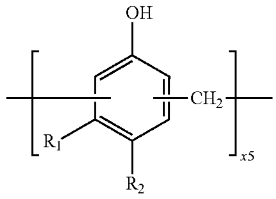

(Iax6)

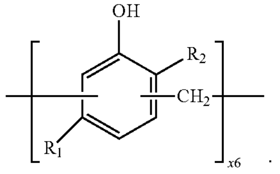

6. The composition of claim 1, wherein in the polymer of structure (II), the repeat unit of structure (IIa), whose mole % k ranges from about 10 mole % to about 20 mole %, is comprised of a mixture of isomeric repeat units having structures (IIax1), (IIax2), (IIax3) (IIax4), (IIax5), and (IIax6), which respectively have mole % values of k1, k2, k3, k4, k5 and k6, where the total of these mole % values ranges from about 10 mole % to about 20 mole %, wherein;

k1, the mole % values of the repeat unit of structure (IIak1), ranges from about 10 to about 20 mole %, k2, the mole % values of the repeat unit of structure (IIak2), ranges from 0 to about 5 mole %, k3, the mole % values of the repeat unit of structure (IIak3), ranges from 0 to about 5 mole %, k4, the mole % values of the repeat unit of structure (IIak4), ranges from 0 to about 5 mole %, k5 the mole % values of the repeat unit of structure (IIak5), ranges from 0 to about 5 mole %, k6 the mole % values of the repeat unit of structure (IIak6), ranges from 0 to about 5 mole %, and further wherein the sum of k1, k2, k3, k4, k5, k6 and l and m equals 100 mole %;

(IIak1)

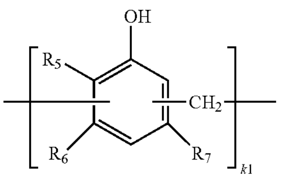

(IIak2)

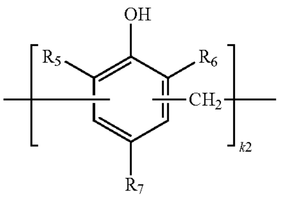

(IIak3)

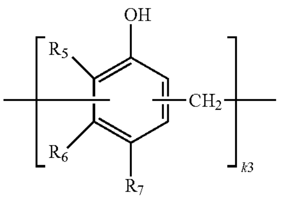

(IIak4)

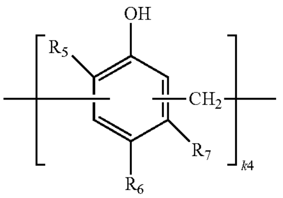

(IIak5)

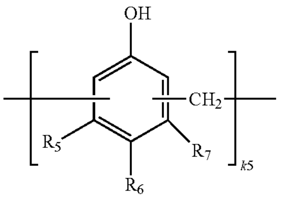

IIak6)

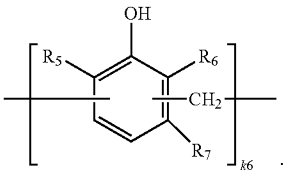

7. The composition of claim 1, wherein said polymer of structure (II) has the more specific structure (II-1), where k1 ranges from about 10 to about 20 mole %, l ranges from about 40 to about 50 mole %, m ranges from about 30 to about 40 mole %, and further wherein for structure (II-1) the sum of k1, l and m is 100 mole %;

(II-1)

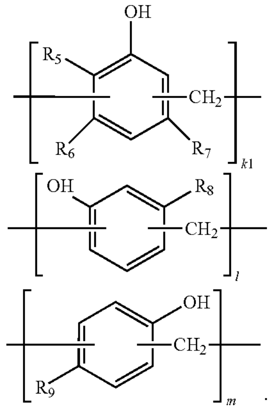

8. The composition of claim 1, wherein in the polymer of structure (II), k ranges from about 15 to about 20 mole %, l ranges from about 40 to about 50 mole %, and m ranges from about 35 to about 40 mole %.

9. The composition of claim 1, wherein component b) said DNQ PAC is one wherein $D_{1c}$, $D_{2c}$, $D_{3c}$ and $D_{4c}$ are individually selected from H or a moiety having structures (IV), and further wherein at least one of $D_{1c}$, $D_{2c}$, $D_{3c}$ or $D_{4c}$ is a moiety having structure (IV).

10. The composition of claim 1, wherein component c) said speed enhancer is an oligomeric fractionated Novolak.

11. The composition of claim 1, wherein component c) said speed enhancer is a compound of structure (VI), a compound of structure (VII) or a mixture of these.

12. The composition of claim 1, wherein component c) said speed enhancer has structure (VI).

13. The composition of claim 1, wherein component c) said speed enhancer has structure (VI) and further where $R_{de1}$, $R_{de2}$, and $R_{de3}$, are all selected from the same C-1 to C-4 alkyl.

14. The composition of claim 1, wherein component c) said speed enhancer has structure (VII).

15. The composition of claim 1, wherein component c) said speed enhancer is a mixture of speed enhancers of structures (VI) and (VII).

16. The composition of claim 1, wherein component c) said speed enhancer is either selected from one having structure (VIa), structure (VIIa) or is a mixture of the speed enhancers of structures (VIa) and (VIIa);

(VIa)

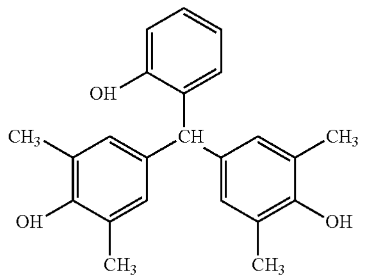

-continued (VIIa)

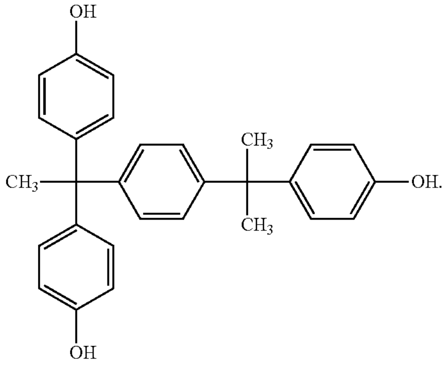

17. The composition of claim 16, wherein component c) said speed enhancer has structure (VIa).

18. The composition of claim 16, wherein component c) said speed enhancer has structure (VIIa).

19. The composition of claim 1, wherein the optional component f) is at least one heterocyclic thiol compound comprising a ring structure chosen from the general structures (H1), (H2) or (H3), or tautomers thereof, and said ring structure is a single ring structure having from 4 to 8 atoms, or a multi ring structure having from 5 to 20 atoms; and wherein the single ring structure or the multi ring structure comprises an aromatic, non-aromatic, or heteroaromatic ring, wherein in said structure (H1), Xt is selected from the group consisting of N(Rt3), C(Rt1)(Rt2), O, S, Se, and Te, in said structure (H2), Y is selected from the group consisting of $C(Rt_3)$ and N, in said structure (H3), Z is selected from the group consisting of $C(Rt_3)$ and N, and in these structures $Rt_1$, $Rt_2$, and $Rt_3$ are independently selected from the group consisting of H, a substituted alkyl group having 1 to 8 carbon atoms, an unsubstituted alkyl group having 1 to 8 carbon atoms, a substituted alkenyl group having 2 to 8 carbon atoms, unsubstituted alkenyl group having 2 to 8 carbon atoms, a substituted alkynyl group having 2 to 8 carbon atoms, unsubstituted alkynyl group having 2 to 8 carbon atoms, a substituted aromatic group having 6 to 20 carbon atoms, a substituted heteroaromatic group having 3 to 20 carbon atoms, unsubstituted aromatic group having 6 to 20 carbon atoms and unsubstituted heteroaromatic group having 3 to 20 carbon atoms, (H1)

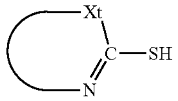

(H2)

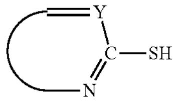

(H3)

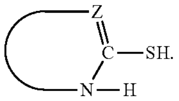

20. A process for imaging a resist comprising the steps;

i) coating the composition claim 1 on a substrate to form a resist film;

ii) selectively exposing the resist film to UV light using a mask to form a selectively exposed resist film;

iii) developing the selectively exposed film to form a positively imaged resist film over the substrate.

21. A process for imaging a resist comprising the steps;

ia) coating the composition of claim 1 on a substrate to form a resist film;

iia) selectively exposing the resist film to UV light using a mask to form a selectively exposed resist film;

iiia) baking the selectively exposed resist film to form a baked selectively exposed resist film;

iva) developing the selectively exposed and baked resist film to form a positively imaged resist film over the substrate.

* * * * *